(12) United States Patent
Takano et al.

(10) Patent No.: US 7,947,332 B2
(45) Date of Patent: *May 24, 2011

(54) PREPREG FOR PRINTED WIRING BOARD, METAL FOIL CLAD LAMINATE AND PRINTED WIRING BOARD, AND, METHOD FOR MANUFACTURING MULTI-LAYER PRINTED WIRING BOARD

(75) Inventors: Nozomu Takano, Chikusei (JP); Kazumasa Takeuchi, Chikusei (JP); Katsuyuki Masuda, Chikusei (JP); Masashi Tanaka, Chikusei (JP); Kazuhito Obata, Chikusei (JP); Yuuji Ooyama, Chikusei (JP); Yoshitsugu Matsuura, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 148 days.

This patent is subject to a terminal disclaimer.

(21) Appl. No.: 11/630,651

(22) PCT Filed: Jun. 22, 2005

(86) PCT No.: PCT/JP2005/011449
§ 371 (c)(1), (2), (4) Date: Aug. 30, 2007

(87) PCT Pub. No.: WO2006/001305
PCT Pub. Date: Jan. 5, 2006

(65) Prior Publication Data
US 2007/0277375 A1    Dec. 6, 2007

(30) Foreign Application Priority Data

Jun. 23, 2004 (JP) ................................. 2004-184856
Jun. 23, 2004 (JP) ................................. 2004 184857
Jun. 23, 2004 (JP) ................................. 2004-184858
Jun. 28, 2004 (JP) ................................. 2004-189607

(51) Int. Cl.
*B05D 3/12* (2006.01)

(52) U.S. Cl. ..... 427/402; 427/369; 427/370; 427/407.3; 29/829

(58) Field of Classification Search .......... 174/250–258; 428/209, 901; 427/369–370, 402, 407.3; 29/829

See application file for complete search history.

(56) References Cited

U.S. PATENT DOCUMENTS
4,191,800 A    3/1980   Holtzman
(Continued)

FOREIGN PATENT DOCUMENTS
CN    1439038    8/2003
(Continued)

OTHER PUBLICATIONS

Translation of the Preliminary Report on Patentability, for Application No. PCT/JP2005/011449, mailed Jan. 11, 2007.
(Continued)

*Primary Examiner* — Cathy Lam
(74) *Attorney, Agent, or Firm* — Antonelli, Terry, Stout & Kraus, LLP.

(57) ABSTRACT

A printed wiring board prepreg according to the present invention is a printed wiring board prepreg obtained by impregnation-drying of a base material with a thermosetting resin composition, and when it is bent by 90°, cracks do not occur in the base material.

14 Claims, 5 Drawing Sheets

U.S. PATENT DOCUMENTS

| | | | | |
|---|---|---|---|---|
| 4,353,954 | A * | 10/1982 | Yamaoka et al. | 428/216 |
| 4,997,702 | A | 3/1991 | Gazit et al. | |
| 5,885,723 | A * | 3/1999 | Takahashi et al. | 428/626 |
| 6,274,225 | B1 * | 8/2001 | Miyake et al. | 428/209 |
| 6,479,615 | B2 * | 11/2002 | Fukuoka et al. | 528/170 |
| 6,572,968 | B2 * | 6/2003 | Takano et al. | 428/391 |
| 6,605,353 | B2 * | 8/2003 | Okada et al. | 428/413 |
| 6,696,155 | B1 * | 2/2004 | Takano et al. | 428/391 |
| 6,713,143 | B2 * | 3/2004 | Hashimoto et al. | 428/40.1 |
| 6,736,988 | B1 | 5/2004 | Gaku et al. | |
| 7,037,586 | B2 * | 5/2006 | Yokota et al. | 428/416 |
| 7,118,798 | B2 * | 10/2006 | Goda et al. | 428/209 |
| 7,138,174 | B2 * | 11/2006 | Takeuchi et al. | 428/297.1 |
| 7,179,519 | B2 * | 2/2007 | Nishinaka et al. | 428/209 |
| 7,384,683 | B2 * | 6/2008 | Echigo et al. | 428/209 |
| 2002/0106521 | A1 | 8/2002 | Hashimoto et al. | |

FOREIGN PATENT DOCUMENTS

| | | |
|---|---|---|
| EP | 1264804 | 12/2002 |
| EP | 1300444 | 4/2003 |
| GB | 2137425 | 10/1984 |
| JP | 49-25499 | 3/1974 |
| JP | 61-211006 | 9/1986 |
| JP | 62-80369 | 5/1987 |
| JP | 63-158217 | 7/1988 |
| JP | 01-245586 | 9/1989 |
| JP | 5-347461 | 12/1993 |
| JP | 6-45364 | 6/1994 |
| JP | 07-045959 | 2/1995 |
| JP | 8-250860 | 9/1996 |
| JP | 10-200258 | 7/1998 |
| JP | 2001-294675 | 10/2001 |
| JP | 2002-080693 | 3/2002 |
| JP | 2002-121303 | 4/2002 |
| JP | 2002-226680 | 8/2002 |
| JP | 2002-292663 | 10/2002 |
| JP | 2003-198132 | 7/2003 |
| JP | 2004-025835 | 1/2004 |
| KR | 2001-0051460 | 6/2001 |
| KR | 2003-0034106 | 1/2003 |
| WO | WO 02/00791 | 1/2002 |

OTHER PUBLICATIONS

Supplementary European Search Report for Application No. EP 05 76 5134, dated Jul. 11, 2007.
Korean Official Action dated Aug. 18, 2008, for Application No. 10-2008-7014435.
Korean Official Action dated Oct. 9, 2009, for Application No. 10-2009-7014942.
Korean Official Action dated Nov. 27, 2009, for Application No. 10-2007-7001494.
Chinese Official Action issued May 8, 2009, for Application No. 200580019300.3.
Korean Official Action issued on Aug. 11, 2009, for Application No. 10-2008-7014435.
Japanese Official Action issued Nov. 9, 2010, in JP Application No. 2006-528562.

* cited by examiner

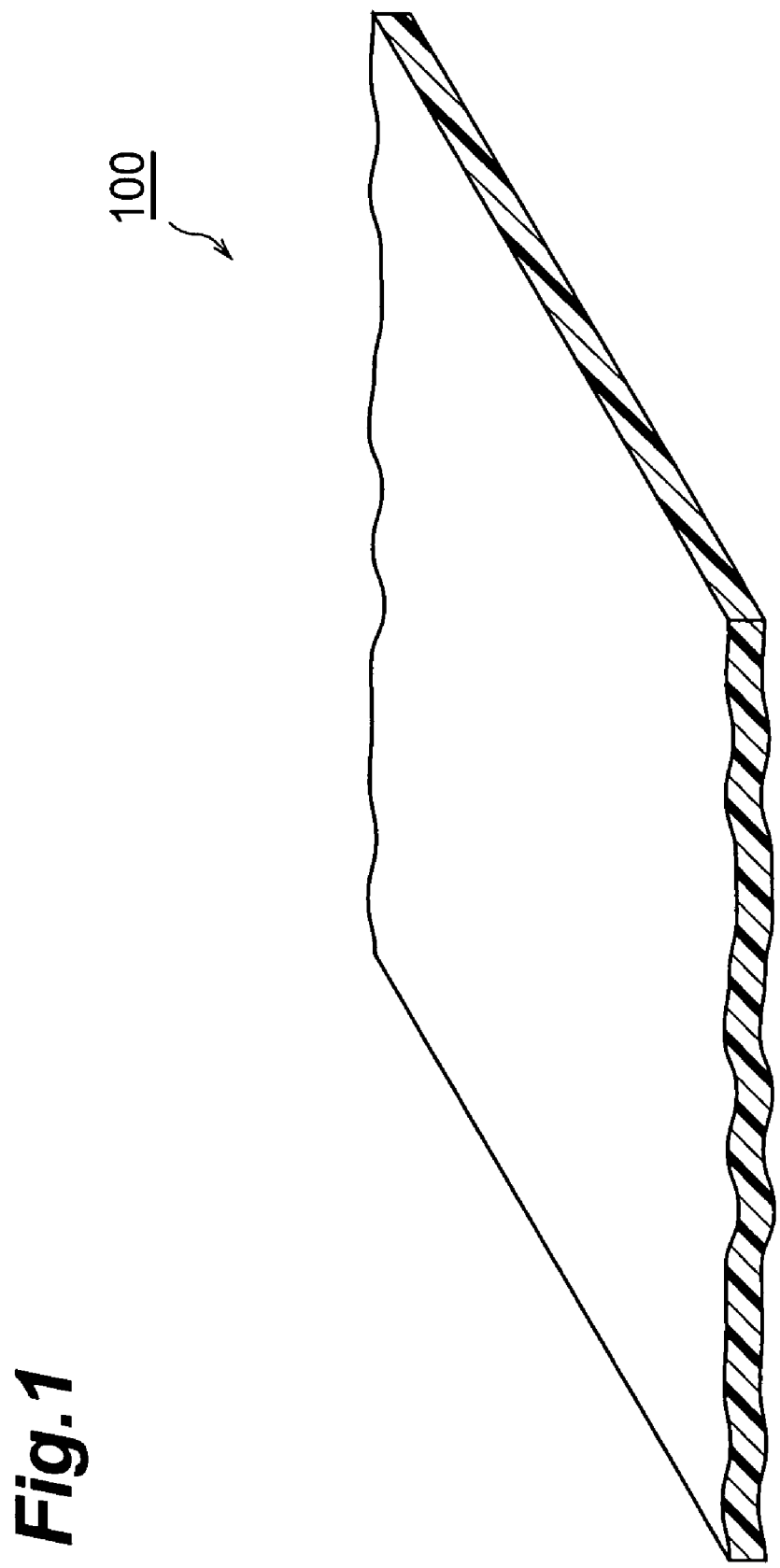

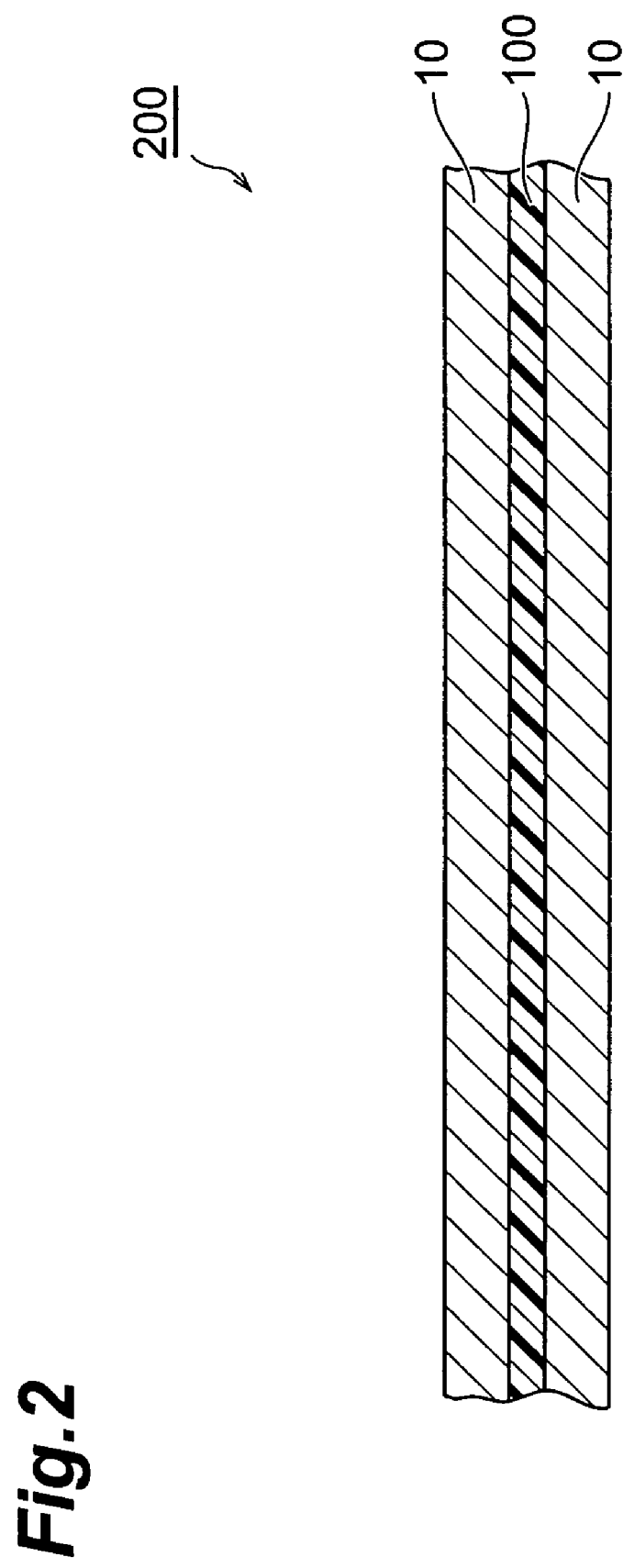

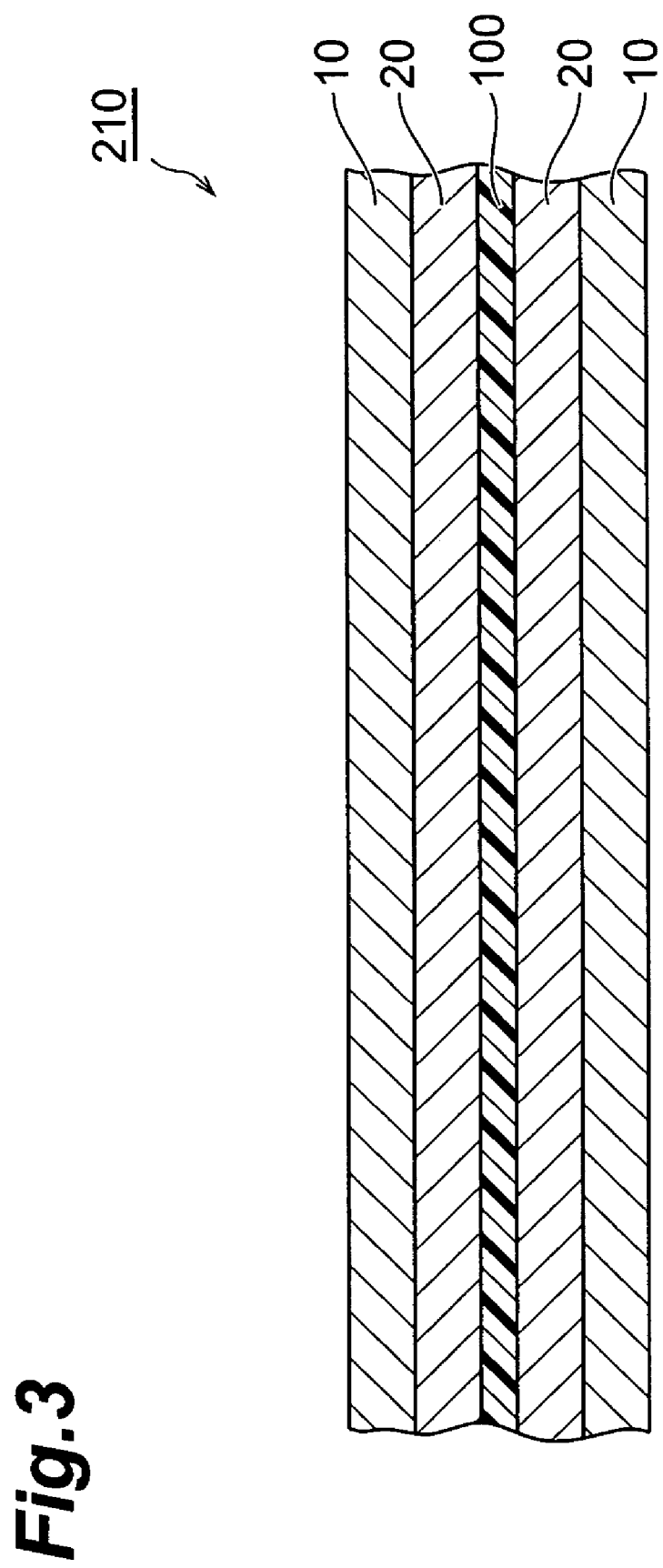

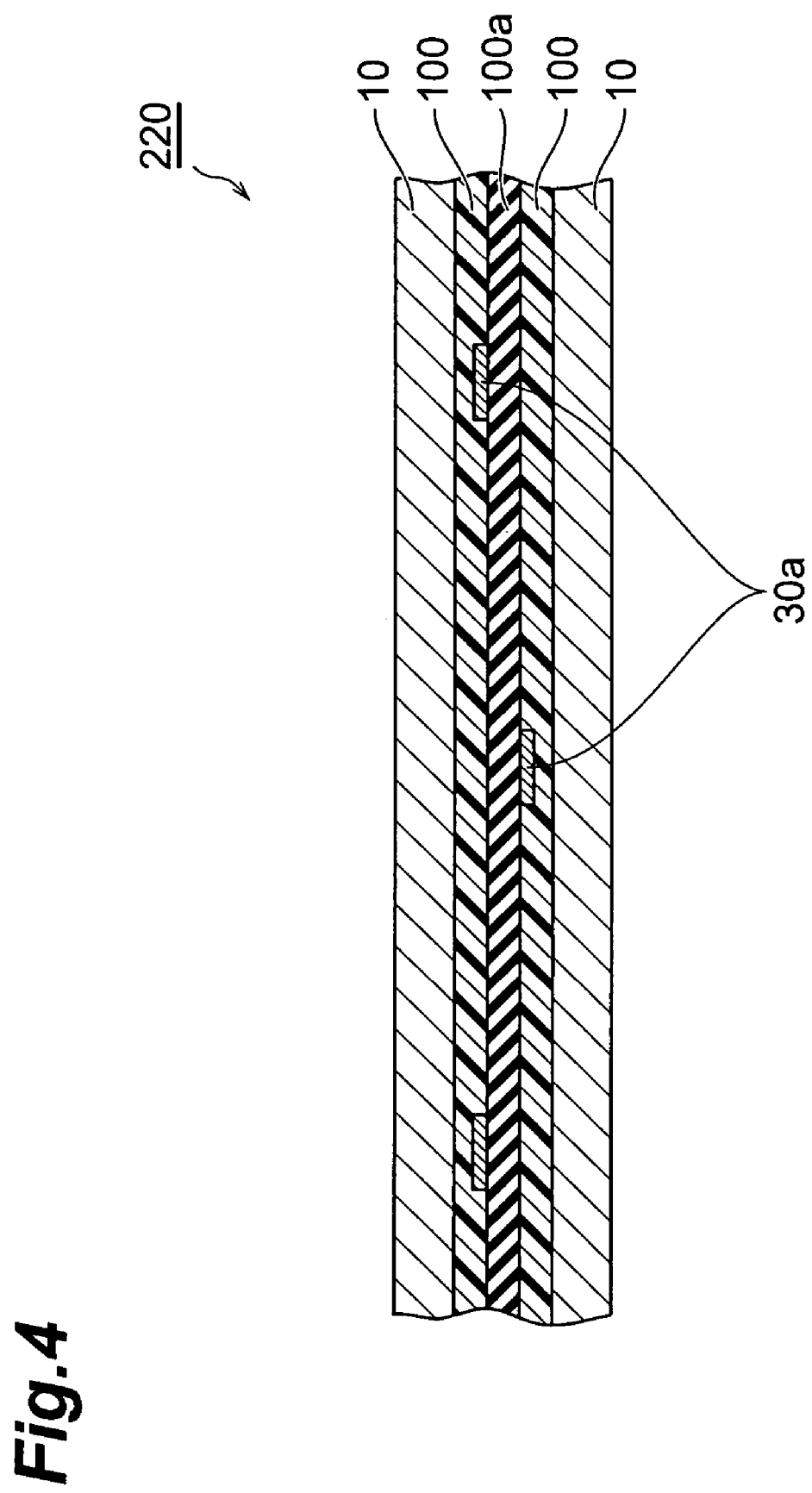

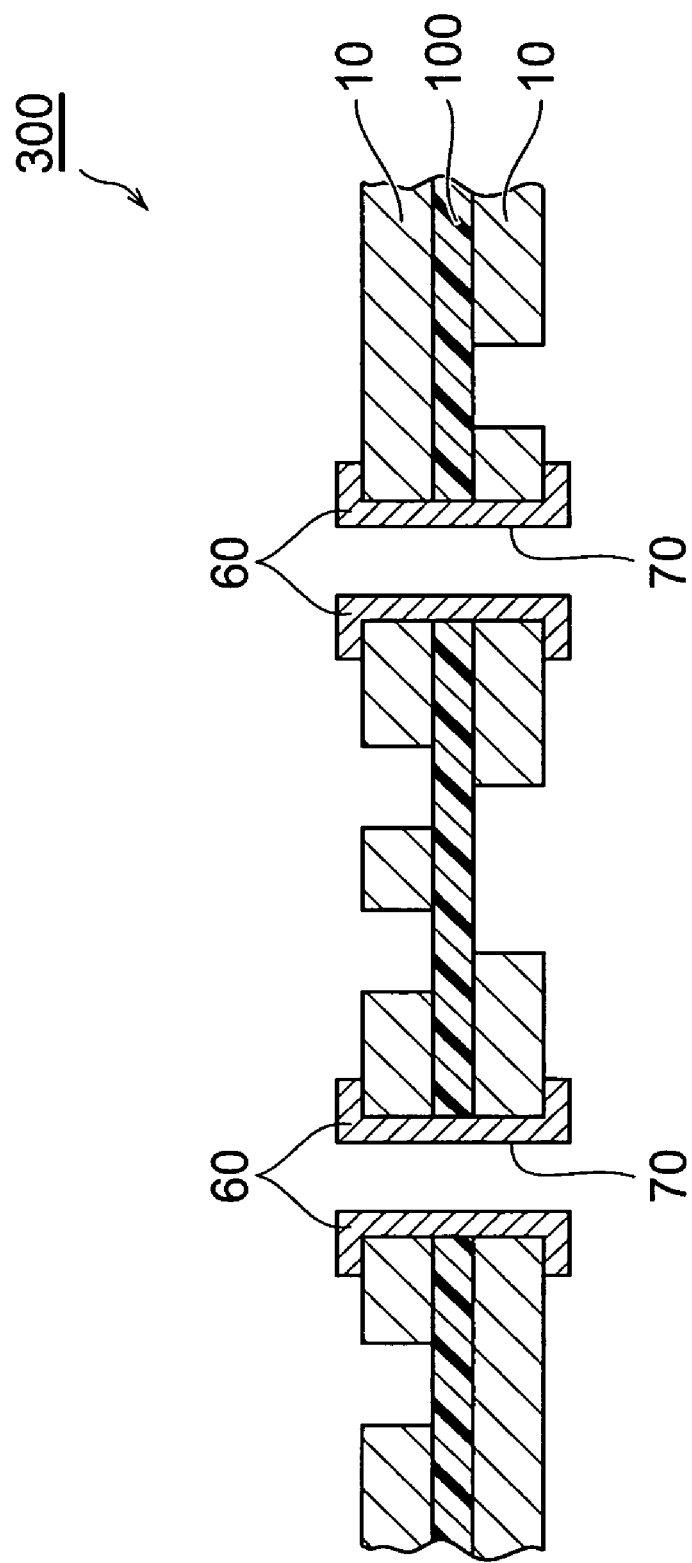

PREPREG FOR PRINTED WIRING BOARD, METAL FOIL CLAD LAMINATE AND PRINTED WIRING BOARD, AND, METHOD FOR MANUFACTURING MULTI-LAYER PRINTED WIRING BOARD

TECHNICAL FIELD

This invention relates to a prepreg used for a printed wiring board, a metal foil-clad laminate and a printed wiring board, and a method of manufacturing a multilayer printed wiring board.

BACKGROUND ART

With the rapid growth of information terminal electronic devices, electronic devices are becoming more compact and thinner. Moreover, as the functions of electronic devices such as mobile phones continue to increase, there is a demand to interconnect various high performance modules including cameras and high-density printed wiring boards.

The number of mounted electronic parts is also increasing rapidly, and since a large number of electronic parts have to be mounted in the limited space of a printed wiring board, not only the rigid printed wiring boards of the prior art, but freely bendable soft substrates are required. As a bendable printed wiring board material, a polyimide-based thermoplastic resin film is mainly used. However, since thermoplastic resins such as polyimide have a low adhesion to metal foil, a technique which the resins are formed by plural resin layers with different physical properties is adopted.

For example, a rigid-flexible substrate which has a rigid part as in the prior art and a flexible part, is also used as a printed wiring board in an information terminal electronic device.

In this rigid-flexible substrate, a prior art laminate is mainly used for the rigid part, and a flexible resin film is mainly used for the flexible part. The rigid-flexible substrate requires a complex multilayer bonding process (see Patent Document 1), and the commercial production tact time is very long.

To stick the rigid part and flexible part together, various forms of adhesive sheet, such as a prepreg containing a resin film or an inorganic substrate, are used. In the case of a resin film, it is common to use resin compositions which are different also from the aforesaid rigid laminate or flexible resin film, and if they are to be used as a multilayer printed wiring board, it gives rise to great limitations in circuit processing and press conditions during multilayer bonding.

When plural resin layers are to be formed as mentioned above, the substrate easily warps or skews when the metal foil is etched or after it is stuck on. As materials of various resin types are involved, circuit processing is more complicated than that with a single resin type. This complexity increases commercial production tact time, and directly results in price increase. There is also the problem that a film of these resins alone has a high water absorption compared with a metal foil-clad laminate containing a prior art glass fabric or non-woven glass fabric, and dimensional stability during etching of the metal foil or after circuit processing is low.

To improve the dimensional stability of the resin film, a glass staple fiber may be blended with the resin (see Patent Document 2), but although the dimensional variation is small compared with the resin alone, there is considerable scatter if only the glass staple fiber is blended in. For this reason, sufficient improvements in processing and connection of imperceptible wiring cannot be expected. In other methods, to reduce warp and skew, a resin layer having a different thermal expansion coefficient may be formed (see Patent Documents 3 and 4), or to achieve a low thermal expansion coefficient, a resin layer having a low thermal expansion coefficient near the metal foil may be formed (see Patent Document 5). However, in all of these techniques, the resin layer is used alone, so there is a limit to reduction of moisture absorption or thermal expansion coefficient, and the potential loss in the reliability of connections in increasingly high density printed wiring boards is a matter of concern.

In general, metal foil-clad laminates and multilayer printed wiring boards are manufactured as follows. A metal foil-clad laminate is generally obtained by heating pressurization of metal foil-clad superimposed on both sides or one side of the prepreg which is semi-cured after a glass fabric or a non-woven glass fabric is impregnated with a thermosetting resin. These materials are alternately superimposed on smooth metal plates of uniform thickness (hereafter referred to as mirror plates), to a required number of sheets. The mirror plates are disposed on the outside of the alternately superimposed sheets, and a cushioning material is further disposed outside these if required. This assembly is placed in the hot platen of a press which can be heated, and heating pressurization is performed to cure the resin of the prepreg. The metal foil-clad laminate which has been formed in one piece in a laminar shape, is then separated from the mirror plates.

In a multilayer printed wiring board, the laminate on which a circuit is formed on both sides or one side (hereafter, inner layer board), has one or more prepregs disposed on both sides or in between. A metal foil or single-sided metal foil-clad laminate is superimposed on both sides. These are superimposed alternately with mirror plates to a required number of sheets. A smooth metal plate having a uniform thickness of about 3-20 mm (hereafter, jig board for multilayer bonding) is superimposed on the outside of this assembly. To align the positions in the circuit of the inner layer board, throughholes are drilled beforehand in identical positions of each material, the mirror plates and the jig board for multilayer bonding, and the assembly is then fixed by locating pins. A cushioning material is further disposed outside these if required. The assembly is placed in the hot platen of a press which can be heated, heating pressurization is performed to cause melt outflow of the resin of the prepreg, and fill the voids in the circuit part of the inner layer board to form a one-piece structure and cure the assembly (hereafter, this procedure is referred to as multilayer bonding). The laminar multilayer printed wiring board is then separated from the mirror plates, jig board for multilayer bonding and locating pins.

The throughholes used for the locating pins are usually formed beforehand not only in the printed wiring board which is the inner layer board, but also in the prepreg. However, in the case of a prepreg wherein a glass fabric or a nonwoven glass fabric is impregnated with a semi-cured resin, resin powder scatters from the surface, end parts and treated surfaces of the prepreg during cutting to the required size, or drilling to form the throughholes. This resin powder scatters easily during carriage, transport and assembly with the metal foil and mirror plates. In the assembly of the metal foil, prepreg and mirror plates, if heating pressurization is performed when this scattered resin powder has entered between the metal foil and mirror plates, it leaves a depression in the metal foil surface of the laminate, or it melts due to the heat and pressure, spreads over the metal foil surface, and hardens in the same way as the prepreg.

Due to this depression, or where resin has melted, spread over the surface and hardened, in the subsequent step for surface circuit processing of the laminate, the metal foil is etched more than necessary, or is not etched since the metal foil surface is covered with the hardened resin layer. For printed wiring boards, these problems cause broken circuit wiring or short circuits, and are fatal defects.

To suppress scattering of the resin powder from the prepreg, the cut end parts can be heated (see Patent Document 6), or heat can be applied during cutting (see Patent Document 7). However, although these methods are effective in the manufacture of ordinary multilayer printed wiring boards, they tend to cause plastic defects when a prepreg cut smaller than an inner layer board is disposed on the inner layer board, and a rigid-flexible substrate is used up to the ends of the heated prepreg. The procedure is also very complex, and there is a possibility of causing various defects such as substrate warp and chipping.

Patent Document 1: JP-A 07-45959
Patent Document 2: JP-A 49-25499
Patent Document 3: JP-A 01-245586
Patent Document 4: JP-A 08-250860
Patent Document 5: JP-A 05-347461
Patent Document 6: JP-B 06-334
Patent Document 7: JP-A 63-158217

DISCLOSURE OF THE INVENTION

Problem to be Solved by the Invention

It is therefore an object of the present invention, which was conceived to resolve the problems inherent in the prior art, to provide a printed wiring board prepreg and metal foil-clad laminate having a small water absorption rate and dimensional variation rate, and superior bending properties when a printed wiring board is formed, together with a method of manufacturing a multilayer printed wiring board using these.

It is a further object of the present invention to provide a printed wiring board prepreg, metal foil-clad laminate and printed wiring board wherein resin exudation from the prepreg to an inner layer board is minimized, superior bending properties are obtained and there is no scattering of resin powder from the prepreg when a multilayer printed wiring board having a projecting inner layer board such as a rigid-flexible substrate is formed, as well as to provide a method of manufacturing a multilayer printed wiring board using these.

It is yet a further object of the present invention to provide a method of manufacturing a multilayer printed wiring board wherein prepreg treatment is suppressed to the minimum, and there is no foreign matter, warp or chipping.

Means for Solving Problem

This invention relates to the following printed wiring board prepregs and metal foil-clad laminates:

(1) A printed wiring board prepreg obtained by impregnation-drying of a base material with a thermosetting resin composition, wherein cracks do not occur in the base material when it is bent by 90°.
(2) The printed wiring board prepreg according to paragraph (1), wherein the thickness of the base material is 5-100 μm.
(3) The printed wiring board prepreg according to paragraph (1) or (2), wherein the thermosetting resin composition includes one or more types of resin material having a weight average molecular weight of 10000-1500000.
(4) A metal foil-clad laminate obtained by superimposing plural printed wiring board prepregs according to any of paragraphs (1)-(3), disposing a metal foil on both sides or one side thereof, heating and pressurizing.
(5) A metal foil-clad laminate obtained by superimposing plural printed wiring board prepregs obtained by impregnation-drying of a base material with a thermosetting resin composition, disposing a metal foil on both sides or one side thereof, heating and pressurizing, wherein cracks do not occur in the base material when it is bent by 90°.
(6) The metal foil-clad laminate according to paragraph (5) or (6), wherein the thickness of the base material is 5-100 μm.
(7) The metal foil-clad laminate according to paragraph (5), wherein the thermosetting resin composition includes one or more types of resin material having a weight average molecular weight of 10000-1500000.

The present invention further relates to the following methods of manufacturing a multilayer printed wiring board.

(8) A method of manufacturing a multilayer printed wiring board, comprising the steps of manufacturing a printed wiring board prepreg by impregnation-drying of a base material with a thermosetting resin composition, manufacturing a metal foil-clad laminate by disposing a metal foil on both sides or one side thereof followed by heating and pressure-forming using a predetermined number of these printed wiring board prepregs, manufacturing a printed wiring board by circuit processing of this metal foil-clad laminate and forming a prepreg or a resin layer of the aforesaid thermosetting resin composition on the surface of this printed wiring board, wherein cracks do not occur in the prepreg when it is bent by 90°.
(9) A method of manufacturing a multilayer printed wiring board, comprising the steps of manufacturing a printed wiring board prepreg by impregnation-drying of a base material with a thermosetting resin composition, manufacturing a metal foil-clad laminate by disposing a metal foil on both sides or one side thereof followed by heating and pressure-forming using a predetermined number of these printed wiring board prepregs, manufacturing a printed wiring board by circuit processing of this metal foil-clad laminate and forming a prepreg or a resin layer of the aforesaid thermosetting resin composition on the surface of this printed wiring board, wherein cracks do not occur in the metal foil-clad laminate when it is bent by 90°.
(10) The method of manufacturing a multilayer printed wiring board according to paragraph (8) or (9), wherein the thickness of the base material is 5-100 μm.
(11) The method of manufacturing a multilayer printed wiring board according to any of paragraphs (8)-(10), wherein the thermosetting resin composition includes one or more types of resin material having a weight average molecular weight of 10000-1500000.
(12) The method of manufacturing a multilayer printed wiring board according to any of paragraphs (8)-(11), wherein in the step for forming the resin layer of the thermosetting resin composition on the surface of the printed wiring board, the resin layer is formed in only part of the surface of the printed wiring board.
(13) The method of manufacturing a multilayer printed wiring board according to any of paragraphs (8)-(12), wherein in the step for forming one or more resin layers of the thermosetting resin composition on the surface of the printed wiring board, the thickness of the formed resin layer is 5-100 μm.

The present invention further relates to the following printed wiring board prepreg, metal foil-clad laminate and printed wiring board, and methods of manufacturing multilayer printed wiring board.

(14) A printed wiring board prepreg obtained by impregnation-drying of the base material with the thermosetting resin composition, wherein the thickness of the base material is 5-30 μm, and the thermosetting resin composition includes one or more types of resin material having a weight average molecular weight of 10000-1500000.

(15) A metal foil-clad laminate obtained by superimposing plural printed wiring board prepregs according to paragraph (14), disposing a metal foil on both sides or one side thereof, and heating and pressurizing.

(16) A printed wiring board obtained by circuit processing of the metal foil-clad laminate according to paragraph (15).

(17) A method of manufacturing a multilayer printed wiring board wherein a printed wiring board prepreg is disposed on the surface of a printed wiring board, a metal foil or a metal foil-clad laminate is disposed on the surface of this printed wiring board, and heating and pressure-forming are performed, wherein one or more printed wiring boards is larger than the printed wiring board prepreg, and the printed wiring board is the printed wiring board according to paragraph (16).

(18) The method of manufacturing a multilayer printed wiring board according to paragraph (17), wherein the printed wiring board prepreg is the printed wiring board prepreg according to paragraph (14).

(19) The method of manufacturing a multilayer printed wiring board according to paragraph (17) or (18), wherein the metal foil-clad laminate is the metal foil-clad laminate according to paragraph (15).

(20) A method of manufacturing a multilayer printed wiring board wherein a printed wiring board prepreg is disposed on the surface of a printed wiring board, a metal foil or a metal foil-clad laminate containing a base material is disposed on the surface of this printed wiring board prepreg, and heating and pressure-forming are performed, wherein one or more printed wiring boards is larger than the printed wiring board prepreg, and cracks do not occur in the base material contained in the printed wiring board when the printed wiring board is bent by 90°.

(21) The method of manufacturing a multilayer printed wiring board according to paragraph (20), wherein the printed wiring board prepreg is a printed wiring board such that cracks do not occur in the base material when it is bent by 90°.

(22) The method of manufacturing a multilayer printed wiring board according to paragraph (20) or (21), wherein the metal foil-clad laminate is a metal foil-clad laminate such that cracks do not occur in the base material when it is bent by 90°.

(23) A method of manufacturing a multilayer printed wiring board wherein a printed wiring board prepreg is disposed on the surface of a printed wiring board, a metal foil or a metal foil-clad laminate is disposed on the surface of this printed wiring board prepreg, and heating and pressure-forming are performed, wherein one or more printed wiring boards is larger than the printed wiring board prepreg, and the printed wiring board prepreg is a printed wiring board prepreg such that resin exudation from the printed wiring board prepreg is 3 mm or less under the heat/pressure-forming conditions of 250° C. or less and 10 MPa or less.

(24) A method of manufacturing a multilayer printed wiring board wherein a printed wiring board prepreg is disposed on the surface of a printed wiring board, a metal foil or a metal foil-clad laminate is disposed on the surface of this printed wiring board, and heating and pressure-forming are performed, wherein one or more printed wiring boards is larger than the printed wiring board prepreg, and resin powder does not scatter when the printed wiring board prepreg is cut.

(25) A method of manufacturing a multilayer printed wiring board, comprising the steps of manufacturing a printed wiring board prepreg by impregnation-drying of a base material with a thermosetting resin composition, manufacturing a printed wiring board by circuit processing of a metal foil-clad laminate, bending and disposing the printed wiring board prepreg so as to sandwich this printed wiring board, disposing a metal foil or metal foil-clad laminate on the outermost layer, and heat/pressure-forming in one operation.

(26) The method of manufacturing a multilayer printed wiring board according to paragraph (25), wherein the printed wiring board prepreg is a printed wiring board prepreg wherein cracks do not occur when it is bent by 90°.

(27) The method of manufacturing a multilayer printed wiring board according to paragraph (25) or (26), wherein the width of one of the printed wiring boards is larger than the width of at least one the printed wiring board prepregs disposed so as to sandwich the printed wiring board.

(28) The method of manufacturing a multilayer printed wiring board according to any of paragraphs (25)-(27), wherein the thickness of the printed wiring board is 10-200 μm.

(29) The method of manufacturing a multilayer printed wiring board according to any of paragraphs (25)-(28), wherein the thickness of the base material is 5-100 μm.

(30) The method of manufacturing a multilayer printed wiring board according to any of paragraphs (25)-(29), wherein the thermosetting resin composition includes one or more types of resin material having a weight average molecular weight of 10000-1500000.

EFFECT OF THE INVENTION

The printed wiring board prepreg and metal foil-clad laminate of the present invention have a low water absorption rate and dimensional variation rate, and can be bent by 90°, and by using these as a printed wiring board, superior bending properties can be obtained.

The present invention provides a method of manufacturing a multilayer printed wiring board having a low water absorption rate and dimensional variation rate, and which exhibits superior bending properties when the printed wiring board is formed.

The present invention provides a printed wiring board prepreg, a metal foil-clad laminate and a printed wiring board, and a method of manufacturing a multilayer printed wiring board wherein, when a multilayer printed wiring board comprising a projecting inner layer board such as a rigid-flexible substrate is formed, resin exudation from the prepreg to the inner layer board is small, bending properties are good, and there is no scatter of resin powder from the prepreg.

The present invention further provides a method of easily manufacturing a multilayer printed wiring board wherein, after a prepreg is bent and various printed wiring boards are disposed therebetween, a metal foil or a metal foil-clad laminate is disposed on the outermost layers, and heat/pressure-forming are performed in one operation so that there are no defects such as foreign matter, warp or chipping.

BRIEF DESCRIPTION OF THE DRAWINGS

FIG. 1 is partial perspective view showing one example of a printed wiring board prepreg according to the present invention.

FIG. 2 is a partial cross-sectional view showing the first example of a metal foil-clad laminate according to the present invention.

FIG. 3 is a partial cross-sectional view showing the second example of a metal foil-clad laminate according to the present invention.

FIG. 4 is a partial cross-sectional view showing the third example of a metal foil-clad laminate according to the present invention.

FIG. 5 is a partial cross-sectional view showing one example of a printed wiring board according to the present invention.

EXPLANATIONS OF NUMERALS

10 . . . metal foil 20 . . . resin layer, 30 . . . circuit, 60 . . . metal plating layer, 70 . . . throughhole, 100 . . . prepreg, 200, 210, 220 . . . metal foil-clad laminate, 300 . . . printed circuit board

BEST MODES FOR CARRYING OUT THE INVENTION

The printed wiring board prepreg of the invention is obtained by impregnating-drying of a base material with a thermosetting resin composition, and the metal foil-clad laminate of the invention is obtained by disposing a metal foil on both sides or one side of this printed wiring board prepreg, heating and pressurization. Hereafter, this printed wiring board prepreg and metal foil-clad laminate will be described in full detail.

The base material used in the invention is not particularly limited provided that it is a glass weave or a nonwoven glass fabric, and glass fiber fabric is particularly preferred. The thickness of the base material is not particularly limited, and 5-100 μm is preferred and 10-50 μm is more preferred. The use of a base material of thickness 5-100 μm is preferred from the viewpoint of improving the bending properties of the printed wiring board prepreg when the printed wiring board prepreg is arranged to form a multilayer structure. Also, the use of a metal foil-clad laminate manufactured using the same printed wiring board prepreg as that which is bent to sandwich the printed wiring board of the invention, is preferred from the viewpoint of improving the bending properties of the metal foil-clad laminate.

The thermosetting resin contained in the thermosetting resin composition used for the printed wiring board prepreg of the invention is not particularly limited provided that it is thermosetting, examples being an epoxy resin, polyimide resin, polyamidoimide resin, triazine resin, phenol resin, melamine resin, polyester resin, cyanate ester resin, or a modification of these resins. Two or more of these resins may be used together, and a solvent may be added to make a solvent solution if required. The solvent may be an alcohol, ether, ketone, amide, aromatic hydrocarbon, ester or nitrile, or a mixed solvent which is a combination of plural types thereof.

The curing agent contained in the thermosetting resin composition may be any of those known in the art, for example if an epoxy resin is used as the thermosetting resin, it may be a dicyandiamide, diaminodiphenylmethane, diaminodiphenylsulfone, phthalic anhydride, anhydrous pyromellitic acid, or a polyfunctional phenol such as phenol novolak and cresol novolak. A curing promoter may also be used in order to promote the reaction of the thermosetting resin and curing agent. The type and blending amount of the curing promoter are not particularly limited, for example, an imidazole compound, organophosphorus compound, tertiary amine or quarternary ammonium salt may be used, and two or more types thereof may be used together.

The thermosetting resin composition used in the invention preferably includes one or more types of resin material having a weight average molecular weight of 10000-1500000. If the weight average molecular weight of the resin material is less than 10000, bending properties decline, and if the weight average molecular weight of the resin material is 1500000 or more, its ability to impregnate the base material declines and heat resistance and bending properties may therefore decline. The blending amount is preferably 10 wt %-80 wt % of the resin solid content of the thermosetting resin composition. If it is less than 10 wt %, bending properties decline, and if it exceeds 80 wt %, the impregnating ability may decline.

The resin material having a weight average molecular weight of 10000-1500000 is not particularly limited, but polyamidoimide resin and acrylate resin may be mentioned. The polyamidoimide resin is more preferably a siloxane-modified polyamidoimide resin. The weight average molecular weight is a converted value obtained relative to standard polystyrene at 25° C. using GPC (gel permeation chromatography). In the case of a polyamidoimide resin, the eluate may be a solution obtained by dissolving 0.06 mol/L phosphoric acid and 0.03 mol/L lithium bromide monohydrate in a 50/50 (volume ratio) mixture of tetrahydrofuran/dimethylformamide.

The polyamidoimide resin is preferably a polyamidoimide resin comprising 50-100 mol %, but more preferably 70-100 mol %, of polyamidoimide molecules containing 10 or more amide groups per molecule. This range can be obtained from the molar number (A) of amide groups per unit weight calculated from the chromatogram of the polyamidoimide obtained by GPC. For example, from the molar number (A) of amide groups contained in the polyamidoimide (a) g, taking 10×a/A as the molecular weight (C) of the polyamidoimide resin containing 10 amide groups in the molecule, the region where the number average molecular weight of the chromatogram obtained by GPC is C or more, is defined as 50-100 mol %. The amount of amide groups may be determined by NMR, IR, the hydroxamic acid-iron color reaction method or the N-bromoamide method.

The polyamidoimide resin used as the resin material of this invention is preferably obtained by reacting a mixture containing a diimidodicarboxylic acid, obtained by reacting a diamine (aromatic diamine) having two or more aromatic rings with a siloxane diamine and anhydrous trimellitic acid, with an aromatic diisocyanate.

In the synthesis of the siloxane-modified polyamidoimide resin having a siloxane structure in the resin, the mixing ratio of the diamine a having two or more aromatic rings, and the siloxane diamine b, is preferably a/b=99.9/0.1-0/100 (molar ratio), more preferably a/b=95/5-30/70 and still more preferably a/b=90/10-40/60. If the mixing ratio of the siloxane diamine b increases, there is a tendency for glass-transition temperature (Tg) to fall. If it decreases, when manufacturing the prepreg, the amount of varnish solvent remaining in the resin tends to increase.

The aromatic diamine may for example be 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis [4-(4-aminophenoxy)phenyl] methane, 4,4'-bis(4-aminophenoxy) biphenyl,bis[4-(4-aminophenoxy)phenyl]ether, bis[4-(4-aminophenoxy) phenyl]ketone, 1,3-bis(4-aminophenoxy)benzene, 1,4-bis (4-aminophenoxy)benzene, 2,2'-dimethylphenyl-4,4'-diamine, 2,2'-bis (trifluoromethyl)biphenyl-4,4'-diamine, 2,6, 2',6'-tetramethyl-4,4'-diamine, 5,5'-dimethyl-2,2'-sulfonyl-biphenyl-4,4'-diamine, 3,3'-dihydroxybiphenyl-4,4'-diamine, (4,4'-diamino)diphenyl ether, (4,4'-diamino) diphenylsulfone, (4,4'-diamino)benzophenone, (3,3'-diamino)benzophenone, (4,4'-diamino)diphenylmethane, (4,4'-diamino)diphenyl ether and (3,3'-diamino)diphenyl ether.

The siloxane diamine may be for example a substance represented by the following general formulae (1)-(4):

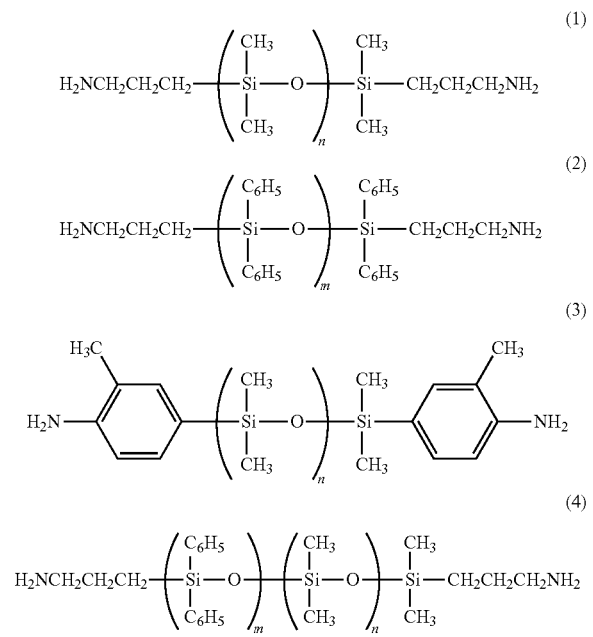

The siloxane diamine represented by the aforesaid general formula (1) may be for example X-22-161AS (amine equivalent 450), X-22-161A (amine equivalent 840), X-22-161B (amine equivalent 1500) (products of Shin-Etsu Chemical Co., Ltd.), BY16-853 (amine equivalent 650) or BY16-853B (amine equivalent 2200) (product of Dow Corning Toray Silicone, Inc.). The siloxane diamine represented by the aforesaid general formula (4) may be for example X-22-9409 (amine equivalent 700) or X-22-1660B-3 (amine equivalent 2200) (products of Shin-Etsu Chemical Co., Ltd.).

In addition to the aforesaid diamine, an aliphatic diamine may be used together, for example the compound represented by the following general formula (5):

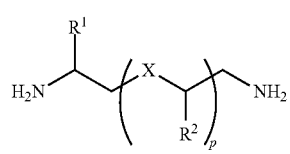

In the aforesaid general formula (5), X may be methylene, sulfonyl, ether, carbonyl or a single bond, $R^1$, $R^2$ may be respectively a hydrogen atom, alkyl, phenyl or a substituted phenyl group, and p is an integer in the range 1-50.

$R^1$, $R^2$ are preferably a hydrogen atom, an alkyl group having 1-3 carbon atoms, phenyl or a substituted phenyl group, and the substituent which may be combined with phenyl may be an alkyl group having 1-3 carbon atoms or a halogen atom. As for the aliphatic diamine, from the viewpoint of obtaining both a low elastic modulus and high Tg, X in the aforesaid general formula (5) is preferably an ether group. This aliphatic diamine may be for example Jeffamine D-400 (amine equivalent 400) or Jeffamine D-2000 (amine equivalent 1000) (products of San Techno Chemical Co.).

The diisocyanate compound used for manufacture of the polyamidoimide resin may be the compound represented by the following general formula (6):

In the aforesaid general formula (6), D is a divalent organic group having at least one aromatic ring, or a divalent aliphatic hydrocarbon group, and is preferably one or more moieties selected from among —$C_6H_4$—$CH_2$—$C_6H_4$—, tolylene, naphthylene, hexamethylene, 2,2,4-trimethylhexamethylene and isophorone.

The diisocyanate compound represented by the aforesaid general formula (6) may be an aliphatic diisocyanate or an aromatic diisocyanate, but it is preferably an aromatic diisocyanate, and it is more preferred to use both.

The aromatic diisocyanate may be 4,4'-diphenylmethane diisocyanate (MDI), 2,4-tolylene diisocyanate, 2,6-tolylene diisocyanate, naphthalene-1,5-diisocyanate or 2,4-tolylene dimer, but MDI is particularly preferred. By using MDI as the aromatic diisocyanate, the flexibility of the obtained polyamidoimide resin can be increased.

The aliphatic diisocyanate may be for example hexamethylene diisocyanate, 2,2,4-trimethylhexamethylene diisocyanate or isophorone diisocyanate.

When an aromatic diisocyanate and an aliphatic diisocyanate are used together, it is preferred to use about 5-10 mol % of the aliphatic diisocyanate relative to the aromatic diisocyanate, since by using the two together, the heat-resistance of the polyamidoimide resin can be further increased.

The conditions for manufacturing the printed wiring board prepreg are not particularly limited, but the thermosetting resin composition is preferably used as a varnish to which a solvent is added. When the printed wiring board prepreg is manufactured, it is preferred that 80% or more of the solvent volatilizes. For this reason, the manufacturing method and drying conditions also are not limited. The temperature during drying is 80° C.-180° C., and the time which includes the gelation time of the varnish is not particularly limited. Regarding the varnish impregnation amount, the resin solid content of the varnish is preferably 30 to 80% of the total amount of varnish resin solids and base material.

The metal foil-clad laminate can be manufactured for example as follows. Plural printed wiring board prepregs according to the present invention are superimposed, a metal foil is superimposed on one side or both sides, and heat/pressure-forming is performed at a temperature within the range of 80° C.-230° C., but preferably 130° C.-200° C., and at a pressure of 0.5 to 8.0 MPa, but preferably 1.5-5.0 MPa. The metal foil-clad laminate may have resin layers between printed wiring board prepregs and a metal foils (refer to FIG. 3). The metal foil-clad laminate having resin layers between printed wiring board prepregs and metal foils can be manufactured for example as follows. The thermosetting resin composition may be applied to various films or metal foils if required, and heating is performed to manufacture resin films wherein the thermosetting resin composition is in a semi-cured state. The resin films are superimposed between printed wiring board prepregs and metal foils to form a laminate and heat/pressure-forming is performed to make the laminate into the metal foil-clad laminate. The resin films between printed wiring board prepregs and metal foils may be in a semi-cured state or cured state by the condition of heat/pressure-forming. The composition of the resin films may be the same as that of the thermosetting resin composition used for the printed wiring board prepreg.

The metal foil used in the present invention is generally copper foil or aluminum foil and 5-200 µm is usually used for the laminate, and 3-35 µm is preferred. The metal foil is preferably copper foil. A three-layer composite structure comprising nickel, nickel-phosphorus, nickel-tin alloy, nickel-iron alloy, lead and lead-tin alloy as the interlayer, a copper layer of 0.5-15 µm and a copper layer of 10-300 µm, or a two-layer composite structure comprising aluminum and copper foil, may also be used.

In a printed wiring board obtained by performing circuit processing of the metal foil-clad laminate, the circuit processing is generally performed in a wiring board manufacturing step.

In a method of manufacturing a multilayer printed wiring board comprising a projecting inner layer board such as a rigid-flexible substrate, the multilayer bonding conditions are not particularly limited, except that one or more printed wiring boards (inner layer boards) must be larger than the printed wiring board prepreg. Plural printed wiring boards (inner layer boards) can also be simultaneously disposed on the same surface during heat/pressure press-forming. In general, after forming plural circuits on the metal foil-clad laminate used as a printed wiring board (inner layer board), contouring is preferably performed to some extent around each circuit by a punch or the like, and the printed wiring board prepreg also cut beforehand to the required size. In the projecting printed wiring board (inner layer board), the circuit part is also preferably protected by a cover lay or solder resist which is often used, if required. If a printed wiring board prepreg is used wherein resin exudation from the printed wiring board prepreg is 3 mm or less under heat/pressure-forming conditions of 250° C. or less, and 10 MPa or less, the heat/pressure press conditions are 250° C. or less, and 10 MPa or less. The printed wiring board prepreg, metal foil-clad laminate and printed wiring board of the invention are suitable for the aforesaid method of manufacturing a multilayer printed wiring board.

The present invention further relates to a method of manufacturing a multilayer printed wiring board comprising the steps of manufacturing a printed wiring board prepreg by impregnating a base material with a thermosetting resin composition and drying, manufacturing a metal foil-clad laminate by disposing a metal foil on both sides or one side thereof using a predetermined number of these printed wiring board prepregs followed by heat/pressure-forming, manufacturing a printed wiring board by circuit processing of this metal foil-clad laminate, and forming a resin layer comprising the thermosetting resin composition on the surface of this printed wiring board.

In the method of manufacturing the multilayer printed wiring board comprising the aforesaid steps of the present invention, the resin layer formed on both sides or one side of the printed wiring board is the same as that of the thermosetting resin composition used for the printed wiring board prepreg. The thermosetting resin composition may be applied to various films or metal foils if required, and after semi-curing, heating and pressure-forming may be performed on the printed wiring board surface to form the resin layer. The heat/pressure conditions are not particularly limited, but preferably follow the printed wiring board prepreg-forming conditions. The resin layer may be formed also by a printed wiring board prepreg. The thickness of the resin layer formed on the printed wiring board surface is preferably 5-100 µm, and more preferably 7-60 µm. This resin layer may also comprise two or more layers as desired. The resin layer may also be formed smaller than the printed wiring board used as an inner layer board, and printed wiring board prepregs may be further disposed on the resin layer to form a multilayer printed wiring board with plural printed wiring board prepregs (refer to FIG. 4). And the resin layer may also be formed on only part of the printed wiring board surface.

In the method of manufacturing the multilayer printed wiring board comprising the aforesaid steps, the printed wiring board prepreg used is a printed wiring board prepreg manufactured by impregnation of a base material with the thermosetting resin composition and drying, wherein cracks do not occur even if it is bent by 90°. The metal foil-clad laminate is a metal foil-clad laminate manufactured by disposing a metal foil on both sides or one side of a predetermined number of printed wiring board prepregs, and heat/pressure-forming, wherein cracks do not occur when it is bent by 90°.

This invention further relates to a method of manufacturing a multilayer printed wiring board comprising the steps of manufacturing a printed wiring board prepreg by impregnating a base material with a thermosetting resin composition and drying, manufacturing a printed wiring board by circuit processing of a metal foil-clad laminate, bending the printed wiring board prepreg so as to sandwich the printed wiring board, disposing a metal foil or the metal foil-clad laminate on the outermost layer, and heat/pressure-forming the assembly in one operation. Hereafter, the method of manufacturing the multilayer printed wiring board comprising these steps will be described in detail.

The method of manufacturing the multilayer printed wiring board comprising the aforesaid steps is characterized by bending the printed wiring board prepreg so that it sandwiches the printed wiring board and disposing. For example, the printed wiring board prepreg may be bent once, and one printed wiring board sandwiched by the bent printed wiring board prepreg, or the printed wiring board prepreg may be bent twice and two printed wiring boards sandwiched by the respective bent parts. Alternatively, it may be bent plural times, and three or more printed wiring boards respectively sandwiched therebetween. The number of times the printed wiring board prepreg is bent and the number of printed wiring board prepregs which are superimposed are arbitrary, and the number of bends is preferably 1-60, and the number of superimposed prepregs is preferably 1-3. The number of bends and the number of superimposed prepregs are preferably selected so that the resin of the printed wiring board prepreg does not peel or fall off due to bending. The printed wiring board prepreg used in the invention is not particularly limited provided that the resin of the printed wiring board prepreg does not peel or fall off due to bending.

The printed wiring board prepreg used in this method is preferably a printed wiring board prepreg wherein cracks do not occur even if bent by 90°. If it is a printed wiring board prepreg wherein cracks do not occur even if bent by 90°, when it is bent and the printed wiring board is sandwiched therein, the resin of the printed wiring board prepreg will not peel or fall off. The metal foil-clad laminate used herein may be a metal foil-clad laminate manufactured using the same printed wiring board prepreg as that which is bent to sandwich the printed wiring board of the invention. And the printed wiring board used may be a printed wiring board manufactured by circuit processing aforesaid metal foil-clad laminate.

In this method, it is preferred that one width of the printed wiring board used as an inner layer board of the multilayer printed wiring board is larger than at least one width of the printed wiring board prepreg disposed so as to sandwich the printed wiring board therein. Specifically in this case, to sandwich the printed wiring board, one width of the printed wiring board prepreg is preferably smaller than one of the width of the printed wiring board, and the other width of the printed wiring board prepreg is preferably larger than at least one of the widths of the printed wiring board.

The bending of the printed wiring board prepreg is preferably of such an extent that there is no peeling or falling-off of the resin in the bent part, and provided that this condition is satisfied, the angle or warp may be any desired value. To minimize the printed wiring board prepreg which is redundant in the bent part, when it is bent, R is preferably 0.01-10 mm. Further, the thickness of the printed wiring board is preferably 10-200 μm. By using a thin printed wiring board as the inner layer board, the printed wiring board prepreg which is redundant in the bent part, is reduced.

The composition and nature of the base material and thermosetting resin composition used in the aforesaid method of manufacturing the multilayer printed wiring board, the method of manufacturing the printed wiring board prepreg, the method of manufacturing the metal foil-clad laminate and the metal foil used, may be same as those described above.

FIG. 1 is a partial perspective view showing one example of a printed wiring board prepreg according to the present invention. Prepreg 100 shown in FIG. 1 is a laminar prepreg which comprises a base material, and a resin composition with which the base material is impregnated.

FIG. 2 is a partial cross-sectional view showing the first example of a metal foil-clad laminate according to this invention. Metal foil-clad laminate 200 comprises prepreg 100, and two metal foils 10 laminated on both sides of prepreg 100.

FIG. 3 is a partial cross-sectional view showing the second example of a metal foil-clad laminate according to this invention. Metal foil-clad laminate 210 comprises prepreg 100, two resin layers 20 laminated on both sides of prepreg 100, and two metal foils 10 laminated on the outer sides of resin layers 20.

FIG. 4 is a partial cross-sectional view showing the third example of a metal foil-clad laminate according to this invention. Metal foil-clad laminate 220 comprises a printed wiring board 100a which is obtained by curing the prepreg sandwiched between metal foils and by forming circuits 30a, two prepregs 100 laminated on both sides of printed wiring board 100a, and two metal foils 10 laminated on the outer sides of prepregs 100. Alternatively, printed wiring board 100a may have circuit 30a on only one side. Furthermore, metal foil-clad laminate 220 may also have one or more pairs of printed wiring boards and prepregs placed between prepreg 100 and printed wiring board 100a. Metal foil 10 may be a resin coated metal foil which has a resin layer on the side which faces the surface of prepreg 100. Metal foil-clad laminate 220 may also have resin layers that have the same composition as the aforesaid resin layer 20, instead of prepregs 100.

Metal foil-clad laminates may also be obtained by heating and pressurizing the aforesaid metal foil-clad laminates.

FIG. 5 is a partial cross-sectional view showing one example of a printed wiring board according to the present invention. Printed wiring board 300 shown in FIG. 5 mainly comprises the same printed wiring board prepreg 100 as the above, and two metal foils 10 laminated on both sides of printed wiring board prepreg 100. Part of metal foil 10 has been removed, and a circuit pattern is formed. Plural throughholes 70 are formed in printed wiring board 300 in a direction substantially perpendicular to its principal surface, and a metal plating layer 60 is formed on the hole wall of this throughhole 70.

Printed wiring board 300 is obtained by forming a circuit in the aforesaid metal foil-clad laminate 200. Circuit-forming (circuit processing) can be performed by a method known in the art, such as the subtractive process. Predetermined circuit components (not shown) are usually mounted on printed circuit board 300.

EXAMPLES

Some examples of the invention will now be described.

Blending Example 1

The resin material shown below was diluted with methyl ethyl ketone to 30 wt % resin solids, and a thermosetting resin composition varnish was thus produced.
  Acrylic resin composition (commercial name: HTR-860P3, Nagase Chemtex Corp.): 80 weight parts
  Epoxy resin (commercial name: Epicoat 828, Japan Epoxy Resins Ltd.): 40 weight parts
  Novolak phenol resin (commercial name: VP6371, Hitachi Chemicals Ltd.): 40 weight parts
  Imidazole (commercial name: 2PZ-CN, Shikoku Chemicals Corp.): 0.4 weight parts.

Blending Example 2

The resin material shown below was diluted with methyl ethyl ketone to 30 wt % resin solids, and a thermosetting resin composition varnish was thus produced.
  Acrylic resin composition (commercial name: HTR-860P3, Nagase Chemtex Corp.): 250 weight parts
  Epoxy resin (commercial name: Epicoat 828, Japan Epoxy Resins Ltd.): 40 weight parts
  Novolak phenol resin (commercial name: VP6371, Hitachi Chemicals Ltd.): 40 weight parts
  Imidazole (commercial name: 2PZ-CN, Shikoku Chemicals Corp.): 0.4 weight parts.

Blending Example 3

The resin material shown below was diluted with methyl ethyl ketone to 30 wt % resin solids, and a thermosetting resin composition varnish was thus produced.
  Acrylic resin composition (commercial name: HTR-860P3, Nagase Chemtex Corp.): 20 weight parts
  Epoxy resin (commercial name: Epicoat 828, Japan Epoxy Resins Ltd.): 40 weight parts
  Novolak phenol resin (commercial name: VP6371, Hitachi Chemicals Ltd.): 40 weight parts
  Imidazole (commercial name: 2PZ-CN, Shikoku Chemicals Corp.): 0.4 weight parts.

Blending Example 4

225 g of a NMP solution of siloxane-modified polyamidoimide resin having a weight average molecular weight of 28000 and 52 amide groups per molecule (40 wt % resin solid content), 20 g cresol novolak epoxy resin (commercial name: YDCN-500, Toto Chemical Co. Ltd.) as the epoxy resin (dimethylacetamide solution containing 50 wt % resin solids) and 1.0 g of 2-ethyl-4-methylimidazole were blended together and stirred for about 1 hour until the resin was uniform, and left to stand at room temperature (25° C.) for 24 hours for degassing to give a thermosetting resin composition varnish.

Blending Example 5

225 g of a NMP solution of siloxane-modified polyamidoimide resin having a weight average molecular weight of 30000 and 38 amide groups per molecule (40 wt % resin solid content), 20 g bisphenol A-type epoxy resin (commercial name: DER331L, Dow Chemical Co. Ltd.) as the epoxy resin (dimethylacetamide solution containing 50 wt % resin solids) and 1.0 g of 2-ethyl-4-methylimidazole were blended together and stirred for about 1 hour until the resin was uniform, and left to stand at room temperature (25° C.) for 24 hours for degassing to give a thermosetting resin composition varnish.

Comparative Blending Example 1

The material shown below was diluted with methyl ethyl ketone and propylene glycol monomethyl ether to 70 wt % of resin solids, and a thermosetting resin composition varnish was thus produced.
Bisphenol A bromide type epoxy resin (epoxy equivalents: 530): 100 weight parts
Dicyandiamide: 4 weight parts
Imidazole (commercial name: 2E4MZ, Shikoku Chemicals Corp.): 0.5 weight parts Example 1

(Manufacture of printed wiring board prepreg and double-sided copper-clad laminate)

A printed wiring board prepreg containing 65 wt % resin solid content was obtained by impregnating a glass fiber fabric of thickness 20 μm with the thermosetting resin composition varnish of Blending Example 1, and heated at 140° C. for 5 to 10 minutes. One printed wiring board prepreg was covered on both sides with copper foil of thickness 18 μm, and a double-sided copper-clad laminate was produced under the press conditions of 170° C., 90 minutes, 4.0 MPa.

Examples 2-5 and Comparative Example 1

(Manufacture of printed wiring board prepreg and double-sided copper-clad laminate)

The printed wiring board prepreg and double-sided copper-clad laminate of Examples 2-5 and Comparative Example 1 were manufactured in the same way as that of Example 1, except that the thermosetting resin composition varnishes of Blending Examples 2-5 and Comparative Blending Example 1 were used instead of the thermosetting resin composition varnish of Blending Example 1.

Comparative Example 2

A polyimide film with 18 μm copper foil (AX182518, commercial name of Nippon Steel Chemical Co., Ltd.) was prepared.

(Evaluation)

The following tests were performed using the obtained printed wiring board prepreg, a double-sided copper-clad laminate and a polyimide film with 18 μm copper foil.

<Bending Properties>

Bending properties were evaluated by cutting a B stage printed wiring board prepreg, a laminate, a polyimide film with 18 μm copper foil, and a double-sided copper-clad laminate and polyimide film wherein the whole surface of the copper foil had been etched, to a width of 10 mm and length of 100 mm, placed on an aluminum plate thickness 5 mm at right angles to the length direction, and the state of the sample after bending at 90° was observed. The bending properties were evaluated based on the following criteria.
A: No abnormalities
B: Partial whitening due to cracks
C: Whitening of whole surface due to cracks.
Table 1 shows the results.

<Measurement of dimensional variation rate and water absorption rate>

Fixed points were marked at the ends of a double-sided copper-clad laminate of 250 mm square and a polyimide film with 18 μm copper foil, and the dimensional variation rate before and after etching the copper foil was measured. The etched sample was left in an atmosphere at 40° C., 90% RH for 96 hours, and the moisture absorption rate and dimensional variation rate were measured. TABLE 1 shows the test results.

TABLE 1

| | | | Ex. 1 | Ex. 2 | Ex. 3 | Ex. 4 | Ex. 5 | Comp. Ex. 1 | Comp. Ex. 2 |
|---|---|---|---|---|---|---|---|---|---|
| Bending properties | Printed wiring board prepreg | | A | A | A | A | A | C | — |
| | Double-sided copper-clad laminate or polyimide film with copper foil | | A | A | A | A | A | C | A |
| | Etched product | | A | A | B | A | A | C | A |
| Dimensional variation rate (%) | After etching | TD direction | 0.025 | 0.026 | 0.025 | −0.025 | −0.022 | −0.055 | −0.063 |
| | | MD direction | 0.025 | 0.023 | 0.025 | −0.030 | −0.028 | −0.035 | −0.105 |
| | After moisture treatment | TD direction | 0.010 | 0.009 | 0.014 | 0.020 | 0.015 | 0.036 | 0.038 |
| | | MD direction | 0.005 | 0.003 | 0.010 | 0.020 | 0.014 | 0.031 | 0.035 |
| Moisture absorption rate (wt %) | | | <0.01 | <0.01 | 0.03 | 0.15 | 0.12 | 0.25 | 0.30 |

For the samples of Examples 1-5, compared with Comparative Example 1, the printed wiring board prepreg, double-sided copper-clad laminate and laminate with copper foil etched over the whole surface (etched product) all have satisfactory bending properties. It is also seen that, since the samples of Examples 1-5 contain the base material, compared with Comparative Examples 1 and 2, the water absorption rate and dimensional variation rate are small. Since Comparative Example 2 is a polyimide film, bending properties are good, but as a base material is not included, the water absorption rate and dimensional variation rate are high.

Example 6

Manufacture of Printed Wiring Board Prepreg, Double-Sided Copper-Clad Laminate and Test Substrate A printed wiring board prepreg containing 65 wt % resin solid content was obtained by impregnating a glass fiber fabric of thickness 20 μm with the thermosetting resin composition varnish of Blending Example 1, and heated at 140° C. for 5 to 10 minutes. One printed wiring board prepreg was covered on both sides with copper foil of thickness 18 μm, and a double-sided copper-clad laminate was produced under the press conditions of 170° C., 90 minutes, 4.0 MPa.

The thermosetting resin composition varnish of Blending Example 1 was also coated on a PET film of thickness 20 μm, and heated at 140° C. for 5-10 minutes as with the printed wiring board prepreg to manufacture a resin film wherein the thermosetting resin composition was in a semi-cured state having a resin layer of thickness 35 μm. After forming a circuit containing pads as reference points at the ends of the obtained double-sided copper-clad laminate, the aforesaid resin film was disposed on both sides so that the thermosetting resin composition surface was in contact with the double-sided copper-clad laminate, and a test substrate was manufactured under the press conditions of 170° C., 90 minutes, 4.0 MPa.

<Bending Properties>

Bending properties were evaluated by cutting a B stage printed wiring board prepreg, a double-sided copper-clad laminate, a polyimide film with 18 μm copper foil, a double-sided copper-clad laminate and polyimide film wherein the whole surface of the copper foil had been etched (etched product) and the test substrate to a width of 10 mm and length of 100 mm, placed on an aluminum plate of thickness 5 mm at right angles to the length direction, and the state of the sample after bending at 90° was observed. The bending properties were evaluated based on the following criteria.

A: No abnormalities
B: Partial whitening due to cracks
C: Whitening of whole surface due to cracks.

Table 2 shows the results.

<Measurement of dimensional variation rate and water absorption rate>

Pads were attached as reference points at the ends of a double-sided copper-clad laminate of 250 mm square and a polyimide film with 18 μm copper foil, a resin layer was placed over this to manufacture a test substrate in the same way as above, and the dimensional variation rate of the test substrate after placing the resin layer was measured. The test substrate was left in an atmosphere at 40° C., 90% RH for 96 hours, and the moisture absorption rate and dimensional variation rate were measured. TABLE 2 shows the test results.

TABLE 2

|  |  |  | Ex. 6 | Ex. 7 | Ex. 8 | Ex. 9 | Ex. 10 | Comp. Ex. 3 | Comp. Ex. 4 |
|---|---|---|---|---|---|---|---|---|---|
| Bending properties | Printed wiring board prepreg | | A | A | A | A | A | C | — |
| | Double-sided copper-clad laminate or polyimide film with copper foil | | A | A | A | A | A | C | A |
| | Etched product | | A | A | B | A | A | C | A |
| | Test substrate | | A | A | A | A | A | C | A |
| Dimensional variation rate (%) | After placing resin layer | TD direction | −0.011 | −0.012 | −0.012 | −0.013 | −0.012 | −0.028 | −0.059 |
| | | MD direction | −0.018 | −0.019 | −0.014 | −0.013 | −0.015 | −0.029 | −0.087 |
| | After moisture treatment | TD direction | 0.012 | 0.011 | 0.016 | 0.022 | 0.017 | 0.041 | 0.05 |
| | | MD direction | 0.007 | 0.005 | 0.012 | 0.022 | 0.014 | 0.036 | 0.047 |
| Moisture absorption rate (wt %) | | | 0.01 | 0.01 | 0.04 | 0.19 | 0.017 | 0.40 | 0.51 |

Examples 7-10 and Comparative Example 3

The printed wiring board prepreg, double-sided copper-clad laminate and test substrate of Examples 7-10 and Comparative Example 3 were manufactured in the same way as that of Example 6, except that the thermosetting resin composition varnishes of Blending Examples 2-5 and Comparative Blending Example 1 were used instead of the thermosetting resin composition varnish of Blending Example 1.

Comparative Example 4

After forming a circuit containing pads as reference points at the ends of a polyimide film with thickness 18 μm copper foil (commercial name: AX182518, Nippon Steel Chemical Co. Ltd.), a cover lay (Nikkan Kogyo Ltd.) was disposed on the circuit surface of the polyimide film for placing film instead of the aforesaid resin film, and a test substrate was manufactured under the press conditions of 170° C., 90 minutes, 4.0 MPa.

(Evaluation)

The following tests were performed using the obtained printed wiring board prepreg, double-sided copper-clad laminate and test substrate.

For Examples 6-10, compared to Comparative Example 3, bending properties are satisfactory for the printed wiring board prepreg, the double-sided copper-clad laminate, the laminate wherein these copper foils are etched over their whole surface (etched product), and product covered by the resin layer (test substrate). It is seen that, since the samples of Examples 6-10 contain a base material, compared with Comparative Examples 3 and 4, the water absorption rate and dimensional variation rate are small. Since Comparative Example 4 is a polyimide film, bending properties are satisfactory, but since a base material is not included, the water absorption rate and dimensional variation rate are high.

Example 11

Manufacture of printed wiring board prepreg and printed wiring board

A printed wiring board prepreg containing 65 wt % resin solid content was obtained by impregnating a glass fiber fabric of thickness 20 μm with the thermosetting resin composition varnish of Blending Example 1, and heated at 140° C. for 5 to 10 minutes. One printed wiring board prepreg was covered on both sides with copper foil of thickness 18 μm, and a double-sided copper-clad laminate was manufactured under the press conditions of 170° C., 90 minutes, 4.0 MPa.

After cutting this double-sided copper-clad laminate to 250 mm×350 mm, a model circuit (straight line) was traced by the usual method, and a printed wiring board was manufactured.

(Manufacture of test substrate)

One printed wiring board prepreg produced with the same thermosetting resin composition as that of the printed wiring board cut beforehand to 150 mm×350 mm, was disposed on the printed wiring board so that the printed wiring board projected by 100 mm, 150 mm×350 mm 18 μm copper foil was disposed so as to cover the surface of the printed wiring board prepreg, and multilayer bonding was performed to produce a test substrate. The multilayer bonding conditions were a forming temperature of 170° C. for 90 minutes, and a pressure of 2.0 MPa.

Example 12 and Comparative Example 5

The printed wiring board prepreg, the double-sided copper-clad laminate and the test substrate of Example 12 and Comparative Example 5 were manufactured in the same way as that of Example 11, except that the thermosetting resin composition varnishes of Blending Example 4 and Comparative Blending Example 1 were used instead of the thermosetting resin composition varnish of Blending Example 1.

(Evaluation)

The following evaluations were performed using the obtained printed wiring board prepreg, double-sided copper-clad laminate and test substrate.

<Bending Properties>

Bending properties were evaluated by cutting a B stage printed wiring board prepreg, double-sided copper-clad laminate and laminate wherein the whole surface of the copper foil had been etched, to a width of 10 mm and length of 100 mm, placed on an aluminum plate of thickness 5 mm at right angles to the length direction, and the state of the sample after bending at 90° was observed. The bending properties were evaluated based on the following criteria:

A: No abnormalities
B: Partial whitening due to cracks
C: Whitening of whole surface due to cracks.

TABLE 3 shows the results.

<Measurement of Resin Exudation>

The resin exudation from the printed wiring board prepreg was found by measuring the length of resin which had exuded from the printed wiring board surface from which the test substrate projected. TABLE 3 shows the test results.

<Measurement of Surface Copper Residue>

The copper residue was evaluated by measuring the number of copper parts which were not etched after etching the copper on the test substrate surface, but which remained due to fusion of resin powder which adhered to the copper foil surface. TABLE 3 shows the test results.

TABLE 3

| | | Ex. 11 | Ex. 12 | Comp. Ex. 5 |
|---|---|---|---|---|
| Bending properties | Printed wiring board prepreg | A | A | C |
| | Double-sided copper-clad laminate | A | A | C |
| | Etched product | A | A | C |
| | Resin exudation amount (mm) | 0.45 | 0.20 | 7.00 |
| | Surface copper residue (no. of parts) | 0 | 0 | 21 |

It is seen that for Examples 11, 12, bending properties are better than for Comparative Example 5, with little resin exudation on the printed wiring board surface, not much copper remaining without being etched, and no scattering of resin powder from the printed wiring board prepreg.

Example 13

Manufacture of Printed Wiring Board Prepreg

A printed wiring board prepreg containing 65 wt % resin solid content was obtained by impregnating a glass fiber fabric of thickness 20 μm with the thermosetting resin composition varnish of Blending Example 1, and heated at 140° C. for 5 to 10 minutes. The obtained printed wiring board prepreg was cut to 225 mm width and 1200 mm length.

(Manufacture of printed wiring board)

Both sides of one printed wiring board prepreg, manufactured in the same way as the aforesaid printed wiring board prepreg, were covered with copper foil of thickness 18 μm, and a double-sided copper-clad laminate was manufactured under the press conditions of 170° C., 90 minutes, 4.0 MPa. This double-sided copper-clad laminate was cut to a width of 250 mm and length of 350 mm, and a model circuit (straight line) was traced by the usual method to obtain a printed wiring board (inner layer board).

(Manufacture of Multilayer Test Substrate)

A multilayer test substrate was manufactured by bending one printed wiring board prepreg of width 225 mm and length 1200 mm twice at every 400 mm in the length direction, inserting one printed wiring board (inner layer board) of thickness 60 μm, width 250 mm and length 350 mm, respectively in the intervals, disposing 18 μm copper foil on the outside and performing multilayer bonding. The length direction of the printed wiring board and the length direction of the printed wiring board prepreg were arranged to be parallel, and multilayer bonding conditions were a forming temperature of 170° C. for 90 minutes and a pressure of 2.0 MPa. During the multilayer bonding, a step for removing resin powder which had scattered from the surface or ends of the printed wiring board prepreg used, was omitted.

Example 14

The printed wiring board prepreg and multilayer test substrate of Example 14 were manufactured as in Example 13, except that, instead of the thermosetting resin composition varnish of Blending Example 1, the thermosetting resin composition varnish of Blending Example 4 was used.

Reference Example 1

A printed wiring board prepreg was prepared as in Example 13, and a multilayer test substrate was prepared as in Example 13 except that this printed wiring board prepreg was cut instead of bending. Specifically, the printed wiring board prepreg was cut to a width of 225 mm and length of 325 mm, and one each of these printed wiring board prepregs was disposed between two printed wiring boards (inner layer boards) and on the outside to manufacture the multilayer test substrate.

Reference Example 2

A printed wiring board prepreg and multilayer test substrate were prepared as in Reference Example 1 except that, instead of the thermosetting resin composition varnish of Blending Example 1, the thermosetting resin composition varnish of Blending Example 4 was used.

(Evaluation)

The following tests were performed using the obtained printed wiring board prepreg and multilayer test substrate.

<Bending Properties>

Bending properties were evaluated by cutting a B stage printed wiring board prepreg to a width of 10 mm and length of 100 mm, placed on an aluminum plate of thickness 5 mm at right angles to the length direction, and the state of the sample after bending at 90° was observed. The bending properties were evaluated based on the following criteria:

A: No abnormalities
B: Partial whitening due to cracks
C: Whitening of whole surface due to cracks.

Table 4 shows the results.

<Measurement of Surface Copper Residue>

The copper residue was evaluated by measuring the number of copper parts which were not etched after etching the copper on the test substrate surface, but which remained due to fusion of resin powder which adhered to the copper foil surface. Table 4 shows the test results.

TABLE 4

|  | Ex. 13 | Ex. 14 | Ref. Ex. 1 | Ref. Ex. 2 |
|---|---|---|---|---|
| Bending properties of printed wiring board prepreg | A | A | A | A |
| Surface copper residue (no. of parts) | 0 | 0 | 2 | 3 |

It is seen that for Examples 13, 14 (multilayer test substrate), compared to Reference Examples 1, 2, the printed wiring board prepreg is bent twice without being cut, so there is no copper remaining without being etched, and very little scattering of resin powder from the ends of the printed wiring board prepreg.

INDUSTRIAL APPLICABILITY

The printed wiring board prepreg and metal foil-clad laminate of the invention have a small water absorption rate and dimensional variation rate, and can be bent at 90°, and superior bending properties can thereby be realized even when they are used in a printed wiring board.

According to the present invention, a method of manufacturing a printed wiring board prepreg, a metal foil-clad laminate, a printed wiring board and a multilayer printed wiring board can be provided wherein, when forming a multilayer printed wiring board having a projecting inner layer board such as a rigid-flexible substrate, there is little resin exudation from the prepreg to the inner layer board, bending properties are good, and there is no scattering of resin powder from the prepreg. Also, a multilayer printed wiring board free of defects, such as foreign matter, warp or chipping, can easily be manufactured.

The invention claimed is:

1. A method of manufacturing a multilayer printed wiring board, the multilayer printed wiring board including a first prepreg and a printed wiring board, wherein the printed wiring board is a printed wiring board obtained by circuit processing of a metal-foil clad laminate obtained by (a) superimposing plural second prepregs obtained by impregnation-drying of a base material with a thermosetting resin composition, wherein the base material is a woven fabric, the thickness of the base material is 5-30 μm, and the thermosetting resin composition includes one or more types of resin material having a weight average molecular weight of 10000-1500000, (b) disposing a metal foil on both sides or one side thereof, and (c) heating and pressurizing; the method comprising:

disposing said first prepreg on a surface of said printed wiring board;

disposing a metal foil or a metal foil-clad laminate on a surface of said first prepreg; and performing heating and pressure-forming, wherein the printed wiring board is larger than the first prepreg.

2. The method of manufacturing a multilayer printed wiring board according to claim 1, wherein the first prepreg is a prepreg obtained by impregnation-drying of a base material with a thermosetting resin composition, wherein a thickness of the base material of the first prepreg is 5-30 μm, and the thermosetting resin composition of the first prepreg includes one or more types of resin material having a weight average molecular weight of 10000-1500000.

3. The method of manufacturing a multilayer printed wiring board according to claim 1, wherein the metal foil-clad laminate disposed on the surface of the first prepreg is a metal foil-clad laminate obtained by impregnation-drying of a base material thereof with a thermosetting resin composition thereof, wherein a thickness of the base material thereof is 5-30 μm, and the thermosetting resin composition thereof includes one or more types of resin material having a weight average molecular weight of 10000-1500000, to form a further prepreg, superimposing a plurality of the further prepregs obtained by the impregnation-drying, disposing a metal foil on both sides or one side thereof, and heating and pressurizing.

4. The method of manufacturing a multilayer printed wiring board according to claim 2, wherein the metal foil-clad laminate disposed on the surface of the first prepreg is a metal foil-clad laminate obtained by impregnation-drying of a base material thereof with a thermosetting resin composition thereof, wherein a thickness of the base material thereof is 5-30 μm, and the thermosetting resin composition thereof includes one or more types of resin material having a weight average molecular weight of 10000-1500000.

5. A method of manufacturing a multilayer printed wiring board that includes a prepreg on a surface of a printed wiring board, the multilayer printed wiring board including at least one printed wiring board, the method comprising:

disposing the prepreg on the surface of the printed wiring board, of the at least one printed wiring board, disposing a metal foil or a metal foil-clad laminate containing a base material on a surface of said prepreg, and performing heating and pressure-forming, wherein the base material is a woven fabric, wherein at least one of the one or more of the printed wiring boards is larger than the prepreg, and wherein cracks do not occur in printed wiring board, of the one or more printed wiring boards, when the printed wiring board is bent by 90° at a square corner of a plate having a thickness of 5 mm placed on the printed wiring board having a width of 10 mm and a length of 100 mm.

6. The method of manufacturing a multilayer printed wiring board according to claim 5, wherein cracks do not occur in the prepreg when the prepreg is bent by 90° at a square corner of a plate having a thickness of 5 mm placed on the prepreg having a width of 10 mm and a length of 100 mm.

7. The method of manufacturing a multilayer printed wiring board according to claim 5, wherein cracks do not occur in the metal foil-clad laminate when the metal foil-clad laminate is bent by 90° at a square corner of a plate having a thickness of 5 mm placed on the metal foil-clad laminate having a width of 10 mm and a length of 100 mm.

8. A method of manufacturing a multilayer printed wiring board having one or more printed wiring boards, comprising:
- disposing a prepreg on a surface of a printed wiring board, of the one or more printed wiring boards,
- disposing a metal foil or a metal foil-clad laminate on the surface of said prepreg, and
- performing heating and pressure-forming,
- wherein the prepreg is obtained by impregnation-drying of a woven fabric with a thermosetting resin composition,
- wherein the one or more printed wiring boards is larger than the prepreg, and wherein the prepreg is a prepreg such that resin exudation from the prepreg is 3 mm or less under the heat/pressure-forming conditions of 250° C. or less and 10 MPa or less.

9. A method of manufacturing a multilayer printed wiring board having one or more printed wiring boards, comprising:
- disposing a prepreg on a surface of a printed wiring board, of the one or more printed wiring boards,
- disposing a metal foil or a metal foil-clad laminate on a surface of said prepreg, and
- performing heating and pressure-forming,
- wherein the prepreg is obtained by impregnation-drying of a woven fabric with a thermosetting resin composition, the one or more printed wiring boards is larger than the prepreg, and resin powder does not scatter when the prepreg is cut.

10. A method of manufacturing a multilayer printed wiring board, comprising the steps of:
- manufacturing a prepreg by impregnation-drying of a base material, which is a woven fabric, with a thermosetting resin composition,
- manufacturing a printed wiring board by circuit processing of a metal foil-clad laminate,
- bending and disposing the prepreg so as to sandwich this printed wiring board,
- disposing a metal foil or metal foil-clad laminate on the prepreg sandwiching the printed wiring board, and
- heat/pressure-forming in one operation,
- wherein a width of the printed wiring board is larger than a width of prepreg disposed so as to sandwich the printed wiring board.

11. The method of manufacturing a multilayer printed wiring board according to claim 10, wherein cracks do not occur in the prepreg when the prepreg is bent by 90° at a square corner of a plate having a thickness of 5 mm placed on the prepreg having a width of 10 mm and a length of 100 mm.

12. The method of manufacturing a multilayer printed wiring board according to claim 10, wherein a thickness of the printed wiring board is 10-200 μm.

13. The method of manufacturing a multilayer printed wiring board according to claim 10, wherein a thickness of the base material is 5-100 μm.

14. The method of manufacturing a multilayer printed wiring board according to claim 10, wherein the thermosetting resin composition includes one or more types of resin material having a weight average molecular weight of 10000-1500000.

* * * * *